United States Patent

Lur et al.

Patent Number: 5,371,036
Date of Patent: Dec. 6, 1994

[54] LOCOS TECHNOLOGY WITH NARROW SILICON TRENCH

[75] Inventors: Water Lur, Taipei; Cheng H. Huang, Hsin-chu, both of Taiwan, Prov. of China

[73] Assignee: United Microelectronices Corporation, Hsinchu, Taiwan, Prov. of China

[21] Appl. No.: 241,337

[22] Filed: May 11, 1994

[51] Int. Cl.$^5$ ............................. H21L 21/76
[52] U.S. Cl. ........................... 437/72; 437/70
[58] Field of Search ...................... 437/72, 70; 148/DIG. 85, DIG. 86, DIG. 117

[56] References Cited

U.S. PATENT DOCUMENTS

| | | | |
|---|---|---|---|
| 5,004,703 | 4/1991 | Zdebel et al. | 437/67 |
| 5,096,848 | 3/1992 | Kawamura | 437/67 |
| 5,229,315 | 7/1993 | Jun et al. | 437/67 |

FOREIGN PATENT DOCUMENTS

| | | | |
|---|---|---|---|
| 57-91535 | 6/1982 | Japan | 437/72 |
| 60-38832 | 2/1985 | Japan | 437/72 |
| 2140951 | 5/1990 | Japan | 437/72 |

OTHER PUBLICATIONS

VSLI Technology, International Edition, by S. M. Sze, McGraw-Hill Book Co., N.Y. NYC 1988 by McGraw-Hill Book, Co., pp. 473-474.

Primary Examiner—George Fourson
Attorney, Agent, or Firm—George O. Saile

[57] ABSTRACT

A new method of local oxidation by means of stress-releasing narrow trenches is described. Pad silicon oxide, silicon nitride, and silicon dioxide layers are formed on a silicon substrate. Portions of these layers not covered by a mask are etched away to provide an opening to the silicon substrate where the field oxidation region is to be formed. The silicon substrate is etched into where it is exposed to form a shallow trench within the opening. Silicon dioxide spacers and silicon nitride spacers are formed on the sidewalls of the opening. The silicon substrate is coated with a spin-on-glass layer. The spin-on-glass layer is cured, then etched back so that the spin-on-glass layer remains only within the shallow trench not covered by the spacers. The silicon nitride spacers are stripped away. Narrow trenches are etched into the silicon substrate under the silicon nitride spacers. The silicon dioxide spacers and spin-on-glass layer are removed leaving the opening entirely exposed. Channel-stops are selectively ion implanted through the opening into the substrate underneath the trenches. The silicon substrate is oxidized within the opening wherein the silicon substrate is transformed to silicon dioxide and wherein the silicon dioxide expands to fill the narrow trenches. The narrow trenches act to relieve stress within the silicon substrate. The silicon dioxide expands vertically to provide a fully recessed surface of the field oxidation region.

20 Claims, 3 Drawing Sheets

LOCOS TECHNOLOGY WITH NARROW SILICON TRENCH

BACKGROUND OF THE INVENTION

1. Field of the Invention

This invention relates to the fabrication of integrated circuit devices and more particularly to a method of local oxidation using stress-releasing narrow silicon trenches before the growth of field oxide in the fabrication of integrated circuits.

2. Description of the Prior Art

Local oxidation of silicon is the conventional lateral isolation scheme. The conventional local oxidation process (LOCOS) is described in *VLSI Technology*, International Edition, by S. M. Sze, McGraw-Hill Book Company, NY, N.Y., c. 1988 by McGraw-Hill Book Co., pp. 473–474. Referring to FIG. 1, a layer of silicon nitride 3 is deposited over a pad oxide 2 overlying a silicon substrate 1. The pad oxide is a thin thermal oxide which allows better adhesion between the nitride and silicon and acts as a stress relaxation layer during field oxide formation. The nitride and oxide layers are etched to leave openings 4 exposing portions of the silicon substrate where the local oxidation will take place. A boron channel-stop layer 5 is ion implanted into the isolation regions. Referring now to FIG. 2A, the field oxide 6 is grown within the openings.

There are many disadvantages to the conventional LOCOS method. Bird's beak encroachment 7 is caused by the lateral oxidation of silicon along the pad oxide under the nitride layer during the high temperature and long time required by the oxidation process. After the silicon nitride and pad oxide layers are removed, as in FIG. 2B, a bird's neck 8 and bird's head 9 are formed because of the stress relaxation inside the field oxide edge. The white ribbon effect, in which there exists a narrow region of nonoxidized silicon, is caused by the diffusion of nitrogen-like material from the compressive-stressed nitride layer edge into the neighboring underlying tensile-stressed pad oxide layer. The oxide thickness tends to thin in narrow openings because of the difference of oxygenic gas flow into different LOCOS opening sizes and the variation of nitride edge-induced stress. The non-recessed surface and tremendous stress that exists around the active area are caused by the inherent volume expansion that is about 2.2 times for the reaction from silicon to silicon dioxide. Many crystalline defects are generated by the relaxation of these tremendous stresses around the bird's beak.

U.S. Pat. No. 5,229,315 to Jun et al shows a trench etch around openings then trench filling followed by oxidation of center polysilicon to complete the isolation scheme. U.S. Pat. No. 5,004,703 to Zdebel et al uses a trench as isolation with sub-resolution dimension. A thermal oxide is used as a trench etch mask. U.S. Pat. No. 5,096,848 to Kawamura teaches oxidation at the center of an opening, then a trench etch around followed by trench filling. All of these methods are complex and have nothing to do with stress relaxation.

SUMMARY OF THE INVENTION

A principal object of the invention is to provide an effective and very manufacturable method to locally oxidize the silicon in an integrated circuit.

Another object of the invention is to provide a method of locally oxidizing the silicon in an integrated circuit whereby a minimum of stress is generated.

Yet another object of the present invention is to provide a method of local oxidation of silicon that will have small "bird's beak" and no white ribbon effect.

A further object is to provide a method of local oxidation which is free of oxide thinning in narrow openings.

Yet another object is to provide a method of local oxidation which has a fully recessed surface.

In accordance with the objects of this invention, a new method of local oxidation by means of stress-releasing narrow trenches is achieved. A pad silicon oxide layer is grown on the surface of a silicon substrate. A silicon nitride layer is deposited overlying the pad silicon oxide layer. A silicon dioxide layer is deposited overlying the silicon nitride layer. Portions of the silicon dioxide, silicon nitride, and pad silicon oxide layers not covered by a mask are etched away to provide an opening to the silicon substrate where the field oxidation region is to be formed. The silicon substrate is etched into where it is exposed to form a shallow trench within the opening where the field oxidation region is to be formed. The shallow trench will provide space for the silicon substrate to expand during subsequent oxidation to provide a fully-recessed surface of the field oxidation region. Silicon dioxide spacers are formed on the sidewalls of the opening. Silicon nitride spacers are formed on the sidewalls of the silicon dioxide spacers. The silicon substrate is coated with a spin-on-glass layer and the spin-on-glass layer is cured. The spin-on-glass layer is etched back so that the spin-on-glass layer remains only within the shallow trench not covered by the silicon dioxide and silicon nitride spacers. The silicon nitride spacers are stripped away so that the silicon substrate within the shallow trench is exposed under the silicon nitride spacers. Narrow trenches are etched into the silicon substrate where the silicon substrate is exposed by the stripped silicon nitride spacers. The narrow trenches will act to relieve stress during subsequent oxidation. The silicon dioxide spacers and spin-on-glass layer are removed leaving the opening where the field oxidation is to be formed entirely exposed. Channel-stops are selectively ion implanted through the opening into the substrate underneath the shallow trench and underneath the narrow trenches. The silicon substrate is oxidized within the opening wherein the silicon substrate is transformed to silicon dioxide and wherein the silicon dioxide expands to fill the narrow trenches. The narrow trenches act to relieve stress within the silicon substrate. The silicon dioxide expands vertically to provide a fully recessed surface of the field oxidation region. The silicon nitride layer and pad silicon oxide layer are removed completing the fully-recessed field oxidation of the integrated circuit.

BRIEF DESCRIPTION OF THE DRAWINGS

In the accompanying drawings forming a material part of this description, there is shown.

DESCRIPTION OF THE PREFERRED EMBODIMENTS

Figure 3:
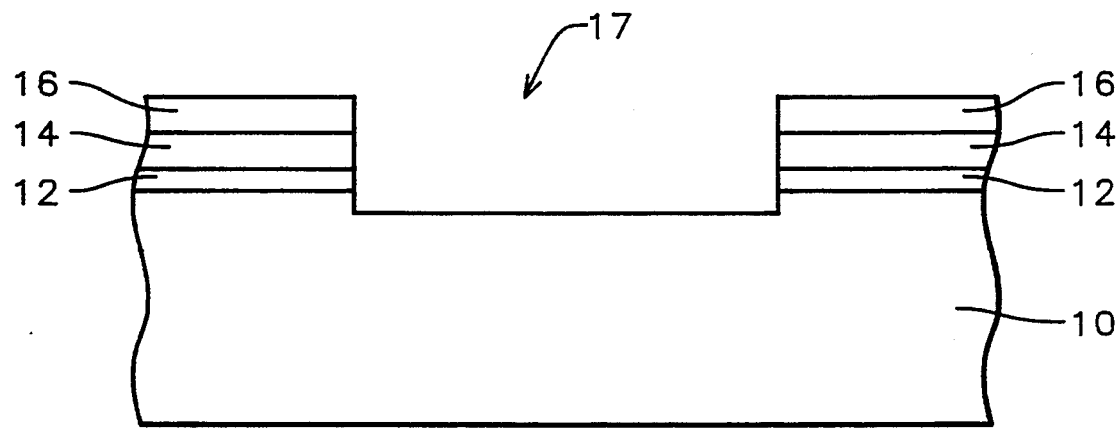
FIGS. 3 through 7 schematically illustrate in cross-sectional representation one preferred embodiment of the present invention.

Referring now more particularly to FIG. 3, the process of the invention will be described. There is shown a monocrystalline silicon substrate 10. A pad oxide layer 12 of silicon dioxide is chemically vapor deposited (CVD) or thermally grown on the surface of the substrate to a preferred thickness of between about 100 to 300 Angstroms. A silicon nitride layer 14 is deposited by CVD to a thickness of between about 500 to 1000 Angstroms. A second layer of silicon dioxide 16 is CVD deposited overlying the silicon nitride layer 14 to a thickness of between about 500 to 1500 Angstroms. The pad oxide, silicon nitride, and silicon dioxide layers are patterned to leave openings 17 exposing portions of the silicon substrate where the local oxidation will take place.

The silicon substrate is etched by reactive ion etching or plasma etching using $Cl_2$ and He or the like where it is exposed within openings 17 to form a trench with a depth of between about 500 to 1500 Angstroms. The non-recessed surface of conventional field oxide growth is caused by the inherent volume expansion of silicon by 2.2 times when it is transformed to silicon dioxide. By etching away some of the silicon before thermal oxidation, enough space is created for the silicon to expand during oxidation to result in a fully recessed surface with the least possible amount of stress. The silicon surface should be etched to a depth of about 5% to 23% of the final field oxide thickness.

Figure 4:
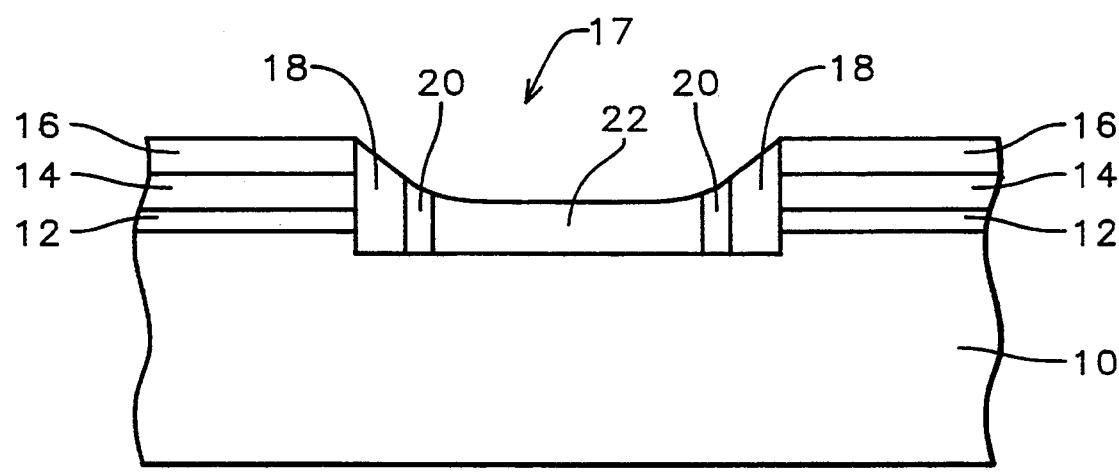

Referring now to FIG. 4, a layer of silicon dioxide is deposited by CVD over the surface of the substrate and within the silicon trench. The layer is etched anisotropically to form spacers 18 with a width of between about 1000 to 2000 Angstroms on the sidewalls of the opening 17. A silicon nitride layer is deposited by CVD over the surface of the substrate and within the silicon trench. This silicon nitride layer is etched anisotropically to form spacers 20 with a width of between about 500 to 1000 Angstroms on the sidewalls of the silicon dioxide spacers 18.

A coating of spin-on-glass material 22 is applied to the substrate and cured as is conventional in the art. The spin-on-glass layer is etched back until the spin-on-glass material remains only within the opening 17 between the silicon nitride spacers 20.

Figure 1:
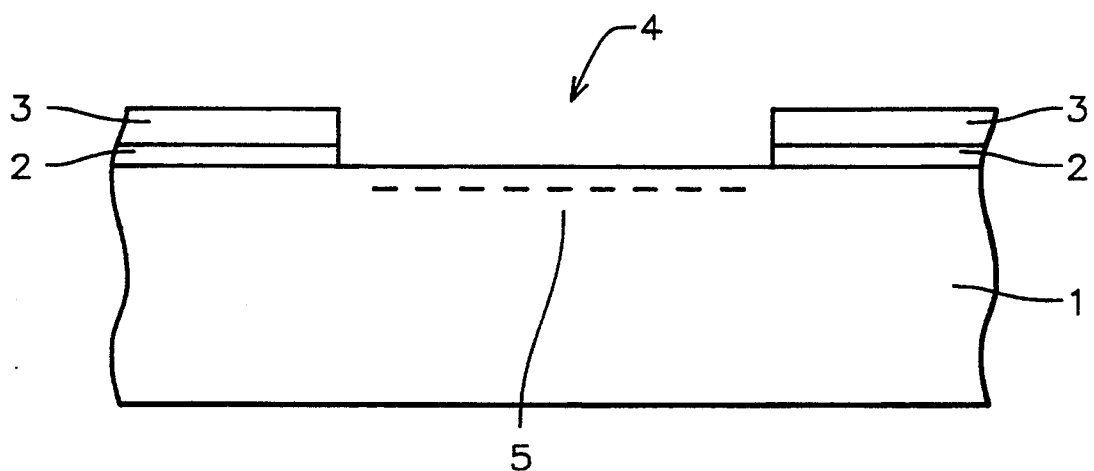
FIGS. 1, 2A, and 2B schematically illustrate in cross-sectional representation a LOCOS process of the prior art.
Figure 2A:
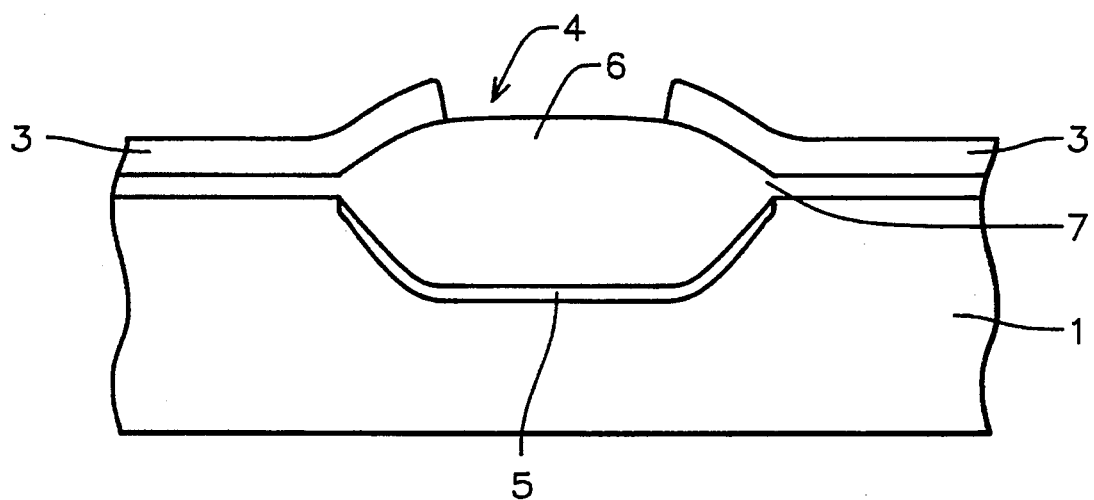
Figure 2B:
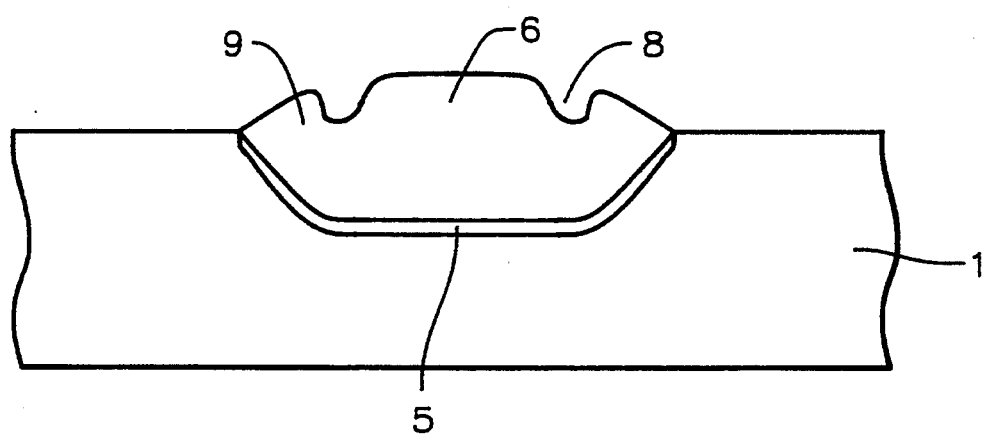
Figure 5:
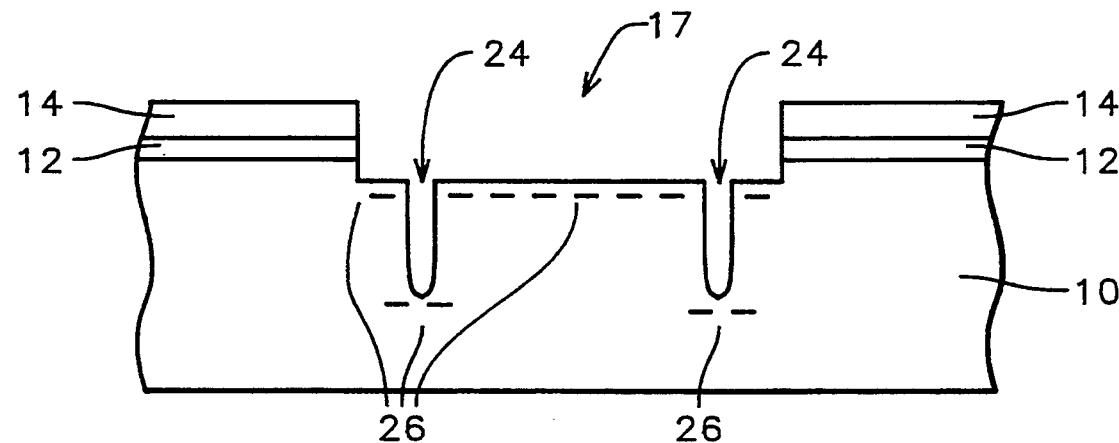

The silicon nitride spacers 20 are stripped using hot $H_3PO_4$ or reactive ion etching with $SF_6$ and He or the like exposing the silicon substrate surface where the spacers were. The exposed silicon substrate 10 is etched by reactive ion etching or plasma etching with $Cl_2$ and He or the like to form narrow trenches 24 which are between about 2000 to 6000 Angstroms deep, as illustrated in FIG. 5. These narrow trenches act to prevent the tremendous stress around the bird's beak that results from lateral expansion of the silicon during oxidation. The relaxation of the stress if it is allowed to build up results in many crystalline defects as well as formation of a bird's neck and bird's head (as illustrated by 8 and 9 in FIG. 2B). The narrow trenches 24 will prevent these defects by preventing the stress build up. The width of the narrow trenches should be between about 40 to 80% of the width of the silicon dioxide spacers 18.

The silicon dioxide layer 16, silicon dioxide spacers 18, and spin-on-glass layer 22 are removed. Channel-stops 26 are selectively ion implanted into the substrate through the opening 17. Boron ions are implanted with a dosage of between about 1 E 13 to 1 E 14 atoms/cm2 and at an energy of between about 10 to 50 KeV. The channel-stop implants serve to prevent inversion of p-type silicon under the field oxide.

Figure 6:
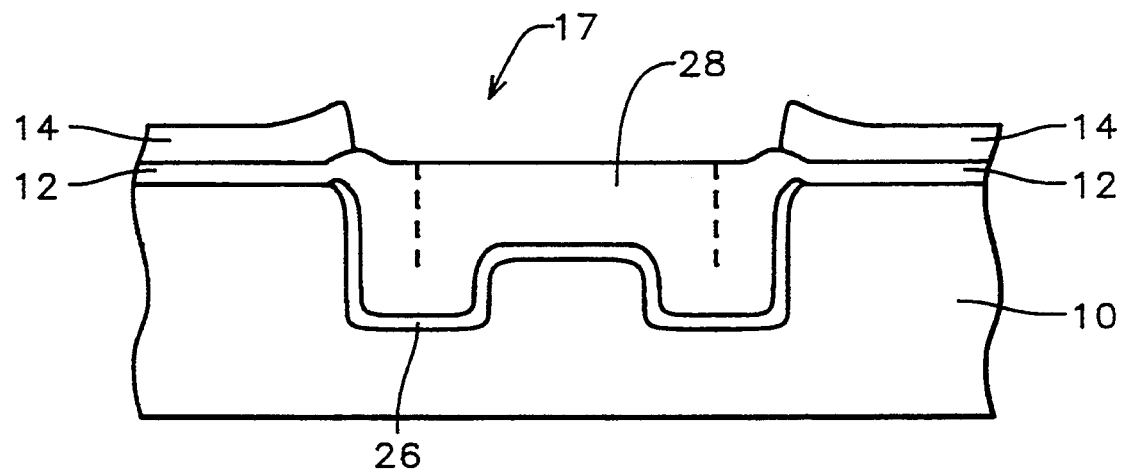

Referring now to FIG. 6, field oxidation is performed within the openings 17 at a temperature of between about 850° to 1100° C. for between about 10 to 200 minutes. Field oxide region 28 is formed.

Figure 7:
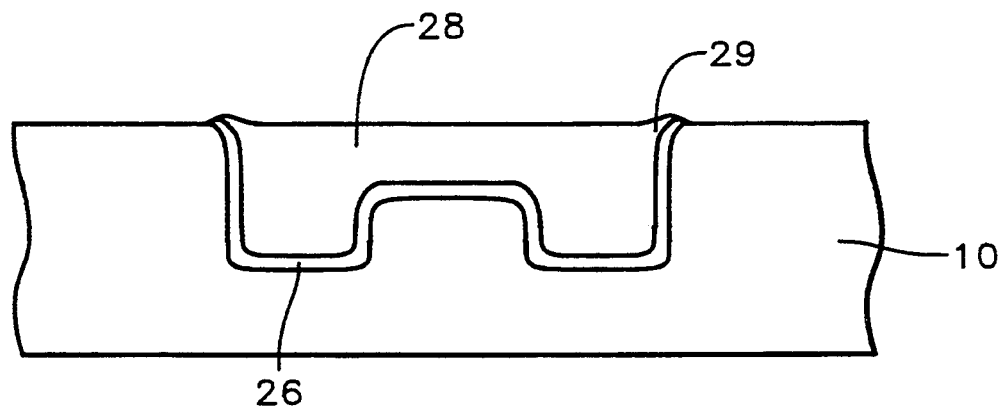

The silicon nitride layer 14 is stripped by hot $H_3PO_4$. The pad oxide layer 12 is removed by dipping in a hydrofluoric acid solution; for example, in $HF:H_2O = 1:10$ for between about 30 to 90 seconds to leave the completed fully recessed field oxide region 28 shown in FIG. 7. The bird's beak 29 is very small.

This completes the local oxidation of the integrated circuit. Only a short oxidation time is required for the process of the invention resulting in a small bird's beak. The white ribbon effect is absent because of the short time oxidation and thinner than usual silicon nitride layer 14. Also, the presence of the narrow silicon trenches results in less stress in the whole system so there is less driving force for causing the diffusion of nitrogen-like material to form the white ribbon. The oxide thickness thinning effect is also absent since the major isolation part of the field oxidation comes from the oxidation of the narrow silicon trench sidewalls which have the same size regardless of the LOCOS opening size. The non-recessed surface and remaining stress is avoided since there is enough space for the silicon to be oxidized and to expand to silicon dioxide.

Figure 8:
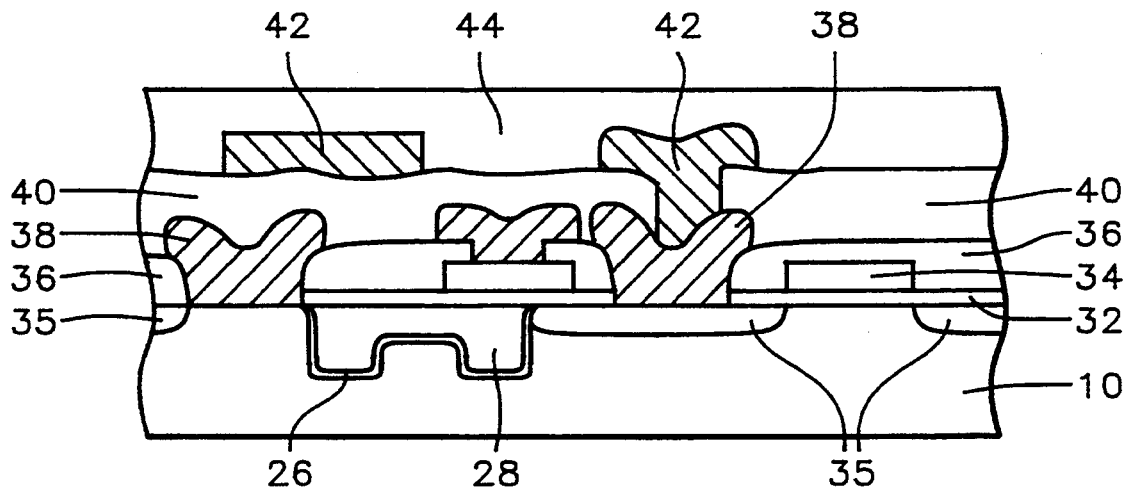
FIG. 8 schematically illustrates in cross-sectional representation a completed integrated circuit of the present invention.

The integrated circuit may be completed as is conventional in the art. For example, referring to FIG. 8, gate oxide layer 32 may be formed followed by patterning to provide openings for buried contact regions. A threshold-adjust ion implant may be required at this point or before the growth of the gate oxide layer 32. Next, gate electrode 34 and source/drain regions 35 are fabricated. Dielectric layer 36, which may be a phosphorus-doped chemical vapor deposited oxide or borophosphosilicate glass (BPSG) is deposited. Contact openings are etched through the dielectric layer to expose the source/drain regions where contacts are desired. Metal layer 38, typically aluminum, is deposited and patterned to complete contacts to the source/drain regions followed by the deposition of an intermetal dielectric layer 40. A second metallization 42 is deposited and patterned. A top capping layer 44 of silicon nitride and/or an oxide complete formation of the integrated circuit.

While the invention has been particularly shown and described with reference to the preferred embodiments thereof, it will be understood by those skilled in the art that various changes in form and details may be made without departing from the spirit and scope of the invention.

What is claimed is:

1. A method of forming a device isolation region of an integrated circuit by means of stress-releasing narrow silicon trenches comprising:
   providing an insulating layer over the surface of a silicon substrate;
   depositing a silicon nitride layer overlying said insulating layer;

depositing a silicon dioxide layer overlying said silicon nitride layer;

etching away portions of said silicon dioxide, said silicon nitride, and said insulating layers not covered by a mask to provide an opening to said silicon substrate where said device isolation region is to be formed;

etching into said silicon substrate through the opening to form a shallow trench within said opening where said device isolation region is to be formed wherein said shallow trench will provide space for said silicon substrate to expand during subsequent oxidation to provide a fully-recessed surface of said device isolation region;

forming silicon dioxide spacers on the sidewalls of said opening and on the trench sidewalls;

forming silicon nitride spacers on the sidewalls of said silicon dioxide spacers and over the trench sidewalls;

coating said silicon substrate with a spin-on-glass layer and curing said spin-on-glass layer;

etching back said spin-on-glass layer wherein said spin-on-glass layer remains only within said shallow trench not covered by said silicon dioxide and said silicon nitride spacers;

stripping said silicon nitride spacers wherein said silicon substrate within said shallow trench is exposed under said silicon nitride spacers;

etching narrow trenches into said silicon substrate where said silicon substrate is exposed under said stripped silicon nitride spacers and wherein said narrow trenches will act to relieve stress during subsequent oxidation;

removing said silicon dioxide spacers and said spin-on-glass layer wherein said opening where said device isolation region is to be formed is entirely exposed;

selectively ion implanting channel-stops through said opening into said substrate underneath said shallow trench and underneath said narrow trenches;

oxidizing said silicon substrate within said opening wherein said silicon substrate is transformed to silicon dioxide and wherein said silicon dioxide expands to fill said narrow trenches and wherein said narrow trenches act to relieve stress within said silicon substrate; and removing said silicon nitride layer and said first insulating layer completing said fully-recessed device isolation of said integrated circuit.

2. The method of claim 1 wherein said first insulating layer is composed of silicon dioxide and has a thickness of between about 100 to 300 Angstroms.

3. The method of claim 1 wherein said silicon nitride layer is deposited by chemical vapor deposition (CVD) to a thickness of between about 500 to 1000 Angstroms.

4. The method of claim 1 wherein said silicon dioxide layer is deposited by chemical vapor deposition (CVD) to a thickness of between about 500 to 1500 Angstroms.

5. The method of claim 1 wherein said shallow trench is etched to a depth of between about 500 to 1500 Angstroms.

6. The method of claim 1 wherein said shallow trench is etched to a depth of between about 5% to 23% of the vertical thickness of said completed device isolation region.

7. The method of claim 1 wherein said silicon dioxide spacers are formed by depositing a layer of silicon dioxide to a thickness of between about 1000 to 2000 Angstroms and anisotropically etching away said silicon dioxide layer leaving said silicon dioxide spacers on the sidewalls of said opening.

8. The method of claim 1 wherein said silicon nitride spacers are formed by depositing a layer of silicon nitride to a thickness of between about 500 to 1000 Angstroms and anisotropically etching away said silicon nitride layer leaving said silicon nitride spacers on the sidewalls of said silicon dioxide spacers.

9. The method of claim 1 wherein said narrow trenches have a width substantially the same as the width of said silicon nitride spacers which is between about 500 to 1000 Angstroms and wherein said narrow trenches are etched into said silicon substrate to a depth of between about 2000 to 6000 Angstroms.

10. The method of claim 1 wherein said narrow trenches have a width of between about 40 to 80% of the width of said silicon dioxide spacers.

11. The method of claim 1 wherein said oxidation of said silicon substrate is performed for between about 10 to 200 minutes at a temperature of between about 850° to 1100° C.

12. The method of field oxidation of an integrated circuit wherein said field oxidation has a fully recessed surface and wherein said field oxidation has a small bird's beak comprising:

providing a pad silicon oxide layer over the surface of a silicon substrate;

depositing a silicon nitride layer overlying said pad silicon oxide layer;

depositing a silicon dioxide layer overlying said silicon nitride layer;

etching away portions of said silicon dioxide, said silicon nitride, and said pad silicon oxide layers not covered by a mask to provide an opening to said silicon substrate where said field oxidation region is to be formed;

etching into said silicon substrate through the opening to form a shallow trench within said opening where said field oxidation region is to be formed wherein said shallow trench will provide space for said silicon substrate to expand during subsequent oxidation to provide a fully-recessed surface of said field oxidation region;

forming silicon dioxide spacers on the sidewalls of said opening and on the trench sidewalls;

forming silicon nitride spacers on the sidewalls of said silicon dioxide spacers and over the trench sidewalls;

coating said silicon substrate with a spin-on-glass layer and curing said spin-on-glass layer;

etching back said spin-on-glass layer wherein said spin-on-glass layer remains only within said shallow trench not covered by said silicon dioxide and said silicon nitride spacers;

stripping away said silicon nitride spacers wherein said silicon substrate within said shallow trench is exposed under said silicon nitride spacers;

etching narrow trenches into said silicon substrate where said silicon substrate is exposed under said stripped silicon nitride spacers and wherein said narrow trenches will act to relieve stress during subsequent oxidation;

removing said silicon dioxide spacers and said spin-on-glass layer wherein said opening where said field oxidation region is to be formed is entirely exposed;

selectively ion implanting channel-stops through said opening and on the trench sidewalls into said substrate underneath said shallow trench and underneath said narrow trenches;

oxidizing said silicon substrate within said opening wherein said silicon substrate is transformed to silicon dioxide and wherein said silicon dioxide expands to fill said narrow trenches and wherein said narrow trenches act to relieve stress within said silicon substrate and wherein said silicon dioxide expands vertically to provide a fully recessed surface of said field oxidation region; and removing said silicon nitride layer and said pad silicon oxide layer completing said fully-recessed field oxidation of said integrated circuit.

13. The method of claim 12 wherein said pad silicon oxide layer has a thickness of between about 100 to 300 Angstroms.

14. The method of claim 12 wherein said silicon nitride layer is deposited by chemical vapor deposition (CVD) to a thickness of between about 500 to 1000 Angstroms.

15. The method of claim 12 wherein said silicon dioxide layer is deposited by chemical vapor deposition (CVD) to a thickness of between about 500 to 1500 Angstroms.

16. The method of claim 12 wherein said shallow trench is etched to a depth of between about 5% to 23% of the vertical thickness of said completed field oxidation region.

17. The method of claim 12 wherein said silicon dioxide spacers are formed by depositing a layer of silicon dioxide to a thickness of between about 1000 to 2000 Angstroms and anisotropically etching away said silicon dioxide layer leaving said silicon dioxide spacers on the sidewalls of said opening.

18. The method of claim 12 wherein said silicon nitride spacers are formed by depositing a layer of silicon nitride to a thickness of between about 500 to 1000 Angstroms and anisotropically etching away said silicon nitride layer leaving said silicon nitride spacers on the sidewalls of said silicon dioxide spacers.

19. The method of claim 12 wherein said narrow trenches have a width of between about 40 to 80% of the width of said silicon dioxide spacers and wherein said narrow trenches are etched into said silicon substrate to a depth of between about 2000 to 6000 Angstroms.

20. The method of claim 12 wherein said oxidation of said silicon substrate is performed for an oxidation time of between about 10 to 200 minutes at a temperature of between about 850° to 1100° C. wherein said oxidation time produces a small bird's beak.

* * * * *